(12) United States Patent
Wang (10) Patent No.: US 6,404,247 B1
(45) Date of Patent: *Jun. 11, 2002

(54) ALL DIGITAL PHASE-LOCKED LOOP

(75) Inventor: Bor-Min Wang, Taichung (TW)

(73) Assignee: Industrial Technology Research Institute (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/555,941

(22) Filed: Nov. 13, 1995

(51) Int. Cl.$^7$ .............................. H03B 21/00; H03L 7/00
(52) U.S. Cl. ....................................... 327/158; 327/105
(58) Field of Search ................................. 327/141, 147, 327/148, 149, 150, 151, 152, 153, 154, 155, 156, 157, 3, 2, 261, 269, 270, 295, 231, 105

(56) References Cited

U.S. PATENT DOCUMENTS

| | | | | |
|---|---|---|---|---|
| 4,019,153 A | * | 4/1977 | Cox, Jr. et al. | 327/5 |
| 4,530,107 A | * | 7/1985 | Williams | 377/47 |
| 4,933,782 A | | 6/1990 | Simonson et al. | 360/51 |
| 4,970,475 A | * | 11/1990 | Gillig | 327/3 |
| 5,012,198 A | * | 4/1991 | Okada et al. | 327/151 |
| 5,124,569 A | | 6/1992 | Phillips | 307/262 |
| 5,157,342 A | | 10/1992 | Atwood et al. | 328/155 |
| 5,181,115 A | | 1/1993 | Flamm et al. | 358/152 |
| 5,365,128 A | * | 11/1994 | Bazes | 327/141 |
| 5,705,945 A | * | 1/1998 | Wee | 327/105 |
| 5,974,103 A | * | 10/1999 | Wang et al. | 327/158 |

FOREIGN PATENT DOCUMENTS

JP 401225220 A * 9/1989 ................ 327/269

OTHER PUBLICATIONS

Stephen M. Walters et al, "Digital Phase–Locked Loop with Jitter Bounded", Jul./1989. IEEE Transactions on Circuits and Systems, vol. 36, No. 7, pp. 980–987.
Loau et al. "GLOBECOM" '91, IEEE "PHDPLL for Sonet Desynchronizer" Jan./1991, pp. 0402–0406.

* cited by examiner

Primary Examiner—Dinh T. Le
(74) Attorney, Agent, or Firm—Finnegan, Henderson, Farabow, Garrett & Dunner, L.L.P.

(57) ABSTRACT

An all-digital phase-locked loop is disclosed which comprises: (a) a digital control oscillator for receiving a local signal and generating an output signal to be locked in with an input signal, (b) a K-counter for providing first control signals to the digital control oscillator; (c) a phase frequency detector for receiving and comparing the output signal received from the digital control oscillator and the input signal, and providing second control signals to the K-counter according to a detected difference between the input and output signals. In the all-digital phase-locked loop, the digital control oscillator comprises a delay line, an address generator and a multiplexer. The delay line comprises a plurality of identical flip-flops each having a phase delay of about $2\pi/L$, L being the number of stages of the delay line, and a trigger clock, which is connected to the shift registers, so as to generate a plurality of phase-different clocks. The address generator receives the first control signals from the K-counter and outputs an address to the multiplexer according to the first control signals, so as to select a clock from the plurality of phase-different clocks. The all-digital phase-locked loop can be advantageously implemented with a sample clock operating at a lower frequency (50 to 75% lower) than that required by the conventional all-digital phase-locked loops, while exhibiting excellent stability which is independent of temperature, process, voltage and other environmental variations such as the initial state.

12 Claims, 8 Drawing Sheets

1/L CYCLE DELAY     WRONG PHASE HOPPING

FIG. 11a

JITTER

FIG. 11b

ALL DIGITAL PHASE-LOCKED LOOP

FIELD OF THE INVENTION

The present invention relates to an all-digital phase-locked loop (PLL). More specifically, the present invention relates to an improved all-digital phase-locked loop, which provides the advantages of lowered cost, high stability, and can be implemented with a very narrow loop bandwidth.

BACKGROUND OF THE INVENTION

A phase-locked loop (PLL) is an electronic circuit for locking an oscillator in phase with an input signal. In other words, a PLL is an electronic circuit for synchronizing, in frequency as well as in phase, an output signal with a reference signal. A PLL can act as a demodulator to demodulate a carrier frequency, or it can be used to track a carrier or synchronizing signal whose frequency varies with respect to time.

PLLs have found a variety of important applications in, for example, communication systems, computers, television engineering, etc. In general, PLLs can be classified, based on its method of implementation, into three main types: analog, mixed digital/analog, and all digital PLLs. A basic analog PLL consists of a phase detector and a low pass filter with a feed back loop closed by a local voltage-controlled oscillator (VCO). The phase detector detects and tracks small differences in phase and frequency between the incoming signal and the VCO signal, and provides output pulses that are proportional to the detected difference. The low-pass filter removes alternating current (ac) components to provide a direct-current (dc) voltage signal to drive the VCO. The input voltage will act to change the output frequency of the VCO to that of the input signal. The phase detector and low-pass filter function as the mixer in a general feedback loop. The output is driven in the direction that will minimize the error signal, such as in frequency. Accordingly, the loop tends to drive the error signal back toward zero frequency. Once the two frequencies are made equal, the output from the VCO will be locked into the input signal, and any phase difference between the two signals will be controlled.

Recently, all-digital PLLs have been developed which provide several advantages over the analog PLLs, including: (1) high yield rate from the IC process; (2) low cost, (3) high stability; (4) can be implemented without external components, such as VCXO, loop filter, etc.; (5) can be implemented with a very narrow loop bandwidth; and (6) can be implemented in a single PLD, thus fostering system development. Some of the most commonly used digital PLLs include SN54LS297 and SN74LS297, both are available from Texas Instrument. The two chips are essentially identical in specification except that the former can operate at a broader temperature range (−55° C. to 125° C.) than the latter (0° C. to 70° C.).

While the all-digital PLLs provide many advantages over their analog counterparts, there is also a very important drawback: they need a substantially higher frequency sample clock than the input clock to divide the input clock period into a fractional of the unit interval (UI). The extent to which the sample clock must be faster than the input clock depends on the maximum permissible output jitter. For an E1-rated output (2.048 M Hz), if the maximum allowable output jitter is to be controlled below 1/32 UI, the conventional all-digital PLL would need a sample clock with a frequency as high as 131.072 M Hz or 65.536 M Hz. The requirement of such a high frequency sample clock can substantially increase the design complexity and the cost thereof.

In an article entitled: "PHDPLL for SONET Desynchronizer", by Chii-Min Loau and Ji-Tsu Wu, it is disclosed a phase-hopping digital PLL (PHDPLL) for high-speed desynchronization which provided very narrow bandwidth (below 1 Hz). The PHDPLL included the conventional EXclusive-OR (EXOR or XOR) phase detector and a phase-hopping digitally controlled oscillator (PHDCO). The PHDPLL uses the delay time of a basic gate (e.g., a buffer or an OR gate) to cause a phase hopping and thereby a phase step, and does not require a sample clock which is required by a conventional all-digital PLL. However, the gate delay utilized in the PHDPLL is highly susceptible to variations due to fluctuations in the local temperature, process and voltage. The variation in the gate delay can range from as high as twice as much as the designed value to as low as one-half of the designed value. Such a large variation in the intended gate delay can result in failures in attempting to acquire the lock-in, or generate a large output jitter.

Because of the above mentioned shortcomings, there exist needs to design an improved all digital PLLs which can be implemented with a sample clock operating at a substantially lower frequency than that is required in the current system, and exhibit the required stability which will be independent of temperature, process, voltage and other environmental variations.

SUMMARY OF THE INVENTION

The primary object of the present invention is to develop an improved all-digital phase-locked loop. More specifically, the primary object of the present invention is to develop an all-digital phase-locked loop which can be implemented with a sample clock operating at a substantially lower frequency that what would be required by the conventional all-digital phase-locked loops. The all-digital phase-locked loop disclosed in the present invention also exhibits excellent stability which is independent of temperature, process, voltage and other environmental variations such as the initial state. With the improved all-digital PLL disclosed in the present invention, the sample clock can be reduced to ½ or ¼ of that required of a conventional all-digital PLLs, while achieving the same or even improved performance at a reduced manufacturing cost. Another distinctive advantage of the improved all-digital PLL disclosed in the present invention is that, because of its excellent stability, the loop's performance can be emulated in advance. This greatly facilitates the implementation and design of the loop, ensures its performance, and keeps the cost down.

In the all-digital PLL disclosed in the present invention, a delay line, which is structurally similar to a pipe line, is designed to provide a plurality of phase-different clocks. The improved all-digital PLL of the present invention comprises five main components: a divide-by-N counter, a divide-by-M counter, a phase-frequency detector (PFD), a K-counter, and a digital control oscillator (DCO). The divisors N and M must be properly chosen in accordance with the clock frequency and the intended application(s), so as to result in the smallest frequency variation for PFD inputs. The PFD is provided to compare the phase and frequency of the two incoming signals $\phi_{in}$ and $\phi_{out}$. The output signals from the PFD depend not only on the phase error but also on the frequency difference $\delta_\omega$ (which equals to $\omega_{in} - \omega_{out}$). The PFD can be constructed from two D-type flip-flops, whose outputs are denoted as "UP" (up) and "DN" (down), respectively. Typically, the outputs of a PFD are initialized at "zero states". If the two input signals are exactly in phase, the positive edges of these two input signals will occur at the same time. Hence, their effects are canceled against each other, and the output from the PFD will be zero until a different situation is detected. When the two input signals are out of phase, the PFD will detect the phase error, which would range from $-2\pi$ to $2\pi$. The output signals "UP" and "DN" from the PFD are sent to the K-counter for adjusting the frequency of the loop's output. When the total pulse width of the "UP" signals is greater than that of the "DN" signals, the frequency of the loop's output will be reduced (i.e., slowed down). On the other hand, when the total pulse width of the "UP" signals is smaller than that of the "DN" signals, the frequency of the loop's output will be increased (i.e., sped up).

The K-counter operates in cooperation with the DCO to produce a signal which is fed back to the PFD through the divide-by-M counter. Included in the K-counter are an "up" counter and a "down" counter. The K-counter works as a digital loop filter. A "carry" output (CA) is generated from the up counter, and a "borrow" output (BO) is generated from the down counter. The two output signals, CA and BO, are sent as inputs to the DCO. If the DN output from the PFD is active, this enables the down section of the K-counter. When the K-counter is under flow, this will produce a "borrow" pulse. The borrow pulse will force the DCO to select a phase-leading local clock, and the loop's output is "advanced". On the other hand, if the UP output from phase detector PFD is active, then this signal will enable the up counter section of the K-counter. When the K-counter is over flow, this will produce a carry pulse. The carry pulse will force the DCO to select a phase-lagging local clock, and the loop's output is "delayed".

In the all-digital phase-locked loop of the present invention, the value of K in the K-counter is an important parameter. If the value of K is too small, then the K-counter will recycle very often, thus generating an undesirably high frequency of carry and/or borrow pulses. This means a high frequency phase hopping of the loop output and a high frequency in the output jitter. On the other hand, if the value of K is too small, the loop's cut-off frequency will be undesirably too low and the lock-in range is small, thus resulting in a prolonged tracking process.

One of the key elements of the DCO of the present invention is a delay line arranged into L stages (i.e., an L-staged delay line). Other elements of the DCO include an up-down counter and a multiplexer. The delay line, which is structurally similar to a pipeline processor, provides a set of phase-different clocks for the DCO to implement a phase-hopping action. The up-down counter accepts the carry and borrow signals from the K-counter and outputs an address to the multiplexer to thereby select a corresponding clock from the set of phase-different clocks, which are provided as outputs from the delay line. In the simplest case, the delay line consists of L phase-different clocks and each pair of neighboring local clocks has a phase difference of $\phi$. Each time the carrier pulse forces the multiplexer to select the phase lagging local clock, the loop's output will be delay by 1/L cycle. Likewise, each time the borrow signal forces the multiplexer to select a phase leading local clock, the loop's output will be advanced by 1/L cycle. In this construction, the value of $\phi$ must satisfy the following relationship:

$$\pi < \phi L < 2\pi$$

The phase delay designed in each stage (of the L stages) has a very significant influence on the loop's output jitter. In order to reduce the amplitude of the output jitter, the value of $\phi L$ should preferably be as close to $2\pi$ as possible. To achieve this, in a preferred embodiment of the present invention, the delay line is implemented using a series of flip-flops and a sample clock having a frequency that is L/2 times the frequency of the loop's output. Thus, with a 32-stage delay line (i.e., L=32), if the maximum permissible output jitter is 1/32 UI, then a sample clock with a frequency 8 times of UI will satisfy the requirement. Therefore, to implement a locked loop for an E1/T1 rate, the present invention can satisfy the requirement by using a sample clock having a frequency of 32.768 M Hz/24.704 M Hz (i.e., using a 32.768 M Hz/24.704 M Hz oscillator). Because a much slower sample clock is required, the present invention is much economical than the conventional all-digital phase locked loops. Furthermore, because the present invention uses a novel design involving a simple delay line to provide the phase-different clocks, it exhibits excellent stability and its performance is unaffected by temperature, process, voltage and/or other environmental variations.

BRIEF DESCRIPTION OF THE DRAWING

The present invention will be described in detail with reference to the drawing showing the preferred embodiment of the present invention, wherein:

FIGS. 10a and 10b demonstrate the low-pass filtering capability of the improved all-digital phase-locked loop disclosed in the present invention; FIG. 11a shows the input frequency and FIG. 11b shows the output frequency.

FIGS. 11a and 11b illustrate how variations in phase delay could affect output jitter; in FIG. 11a, the total delay time Lφ is greater than 2π, whereas, in FIG. 11b, the total delay time Lφ is less than 2π.

DETAILED DESCRIPTION OF THE PREFERRED EMBODIMENT

The present invention discloses an improved all-digital phase-locked loop. The main advantages of the all-digital phase-locked loop disclosed in the present invention are that it can be implemented with a sample clock operating at a significantly lower frequency than that required by the conventional all-digital phase-locked loops, and that it exhibits excellent stability which is independent of temperature, process, voltage and other environmental variations such as the initial state. With the improved all-digital PLL disclosed in the present invention, the sample clock can be reduced to ½ or ¼ of that required of a conventional all-digital PLLs, while achieving the same or even better performance at a reduced manufacturing cost. The excellent stability allows the performance of the novel construction of the improved all-digital PLL disclosed in the present invention to be emulated in advance, thus greatly facilitating the implementation and design of the loop and keeping the cost down.

Figure 1:
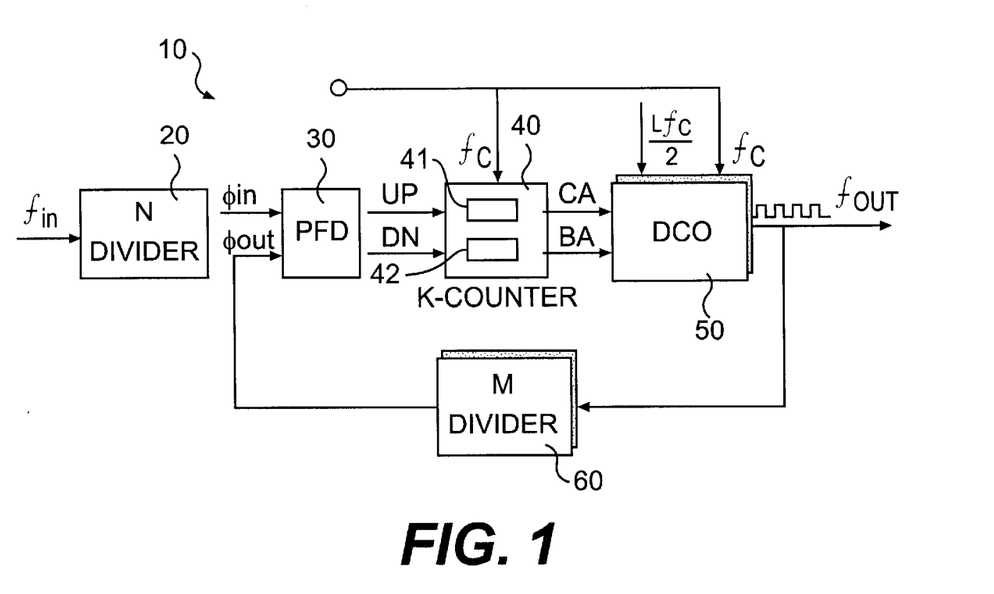
FIG. 1 is a functional block diagram of a preferred embodiment of the improved all-digital phase-locked loop disclosed in the present invention.

FIG. 1 is a functional block diagram of a preferred embodiment of the improved all-digital phase-locked loop 10 disclosed in the present invention. The improved all-digital PLL 10 of the present inventions comprises five main components: a divide-by-N counter 20, a phase-frequency detector (PFD) 30, a K-counter 40, a digital control oscillator (DCO) 50, and a divide-by-M counter 60. The PFD 30 is provided to compare the phase and frequency of the two incoming signals $\phi_{in}$ and $\phi_{out}$ (both signals $\phi_{in}$ and $\phi_{out}$ are considered as input signals to the PFD 30). The output signals from the PFD 30 (shown as UP and DN) depend not only on the phase error but also on the difference in frequency $\delta_\omega$ (which equals to $\omega_{in}-\omega_{out}$) between signals $\phi_{in}$ and $\phi_{out}$ when the loop has not yet acquired a lock-in state. Preferably, the values of N and M are chosen so as to result in the smallest frequency variation between the incoming signals to the PFD 30, $\phi_{in}$ and $\phi_{out}$. Also shown in FIG. 1 are $f_c$, $Lf_c/2$, and $f_{in}$. The symbol $f_c$ represented signals from a local clock (or more specifically an unaltered local clock) whose phase and frequency are to be modified so as to be locked in with the input clock $f_{in}$. For reasons to be discussed subsequently, the symbol $Lf_c/2$ represents signals from a sample clock, which is connected to a delay line, to be discussed later, for locking the local clock with the input clock. FIG. 1 shows that the signals from the local clock, $f_c$, can be input to either the K-counter 40 or directly to the digital control oscillator (DCO) 50.

Figure 2:
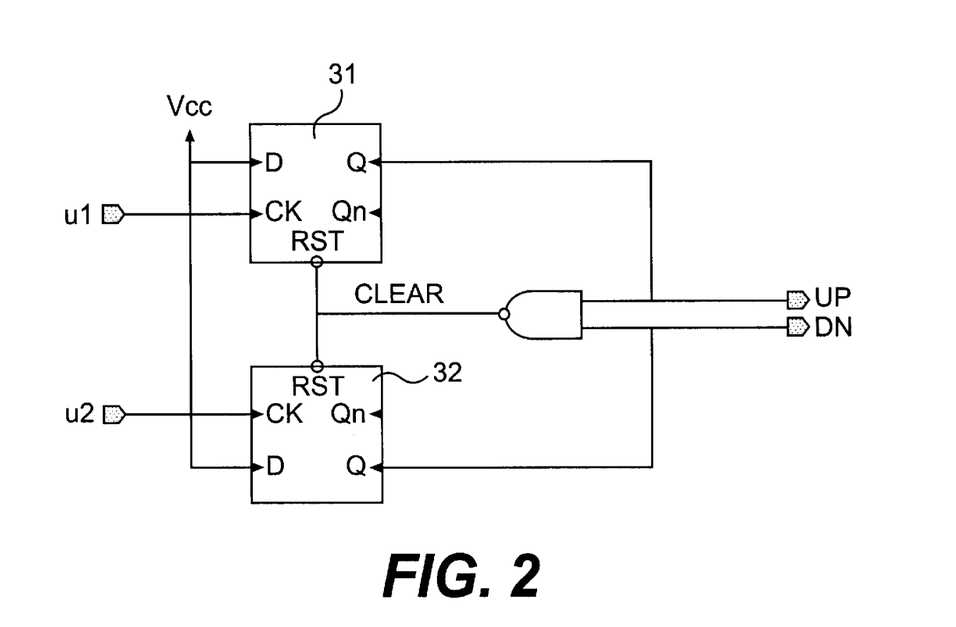
FIG. 2 is a schematic diagram of a preferred embodiment of the phase-frequency detector (PFD) described in the all-digital phase-locked loop as shown in FIG. 1.
Figure 3A:
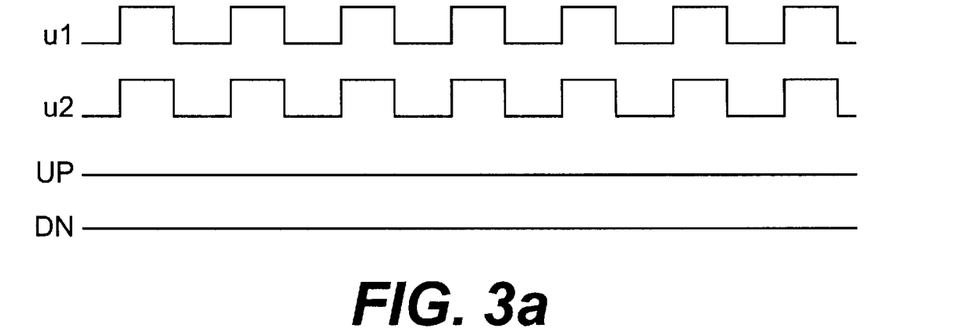
FIG. 3a shows the waveforms associated with the phase-frequency detector (PFD), when there is no (i.e., zero) phase error; the output signal from the PFD is always at the 0 state.
Figure 3B:
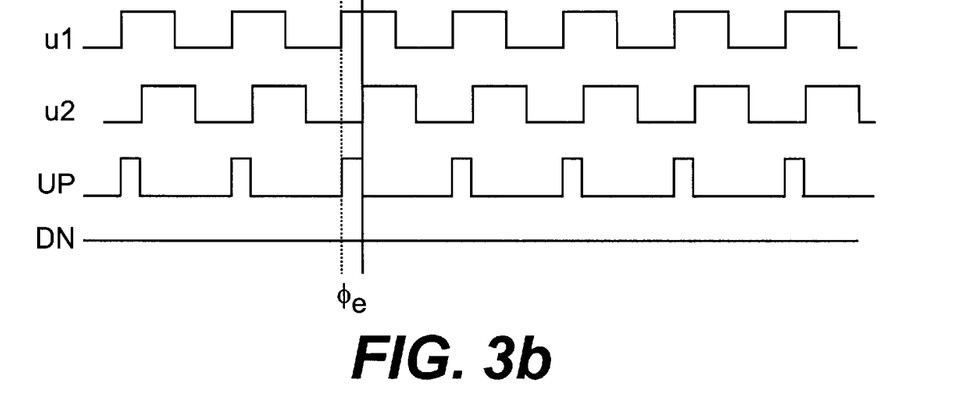
FIG. 3b shows the waveforms associated with the phase-frequency detector (PFD), when there is a positive phase error; the UP portion of the output signal from the PFD is pulsed so as to cause the PFD to be at the +1 state.
Figure 3C:
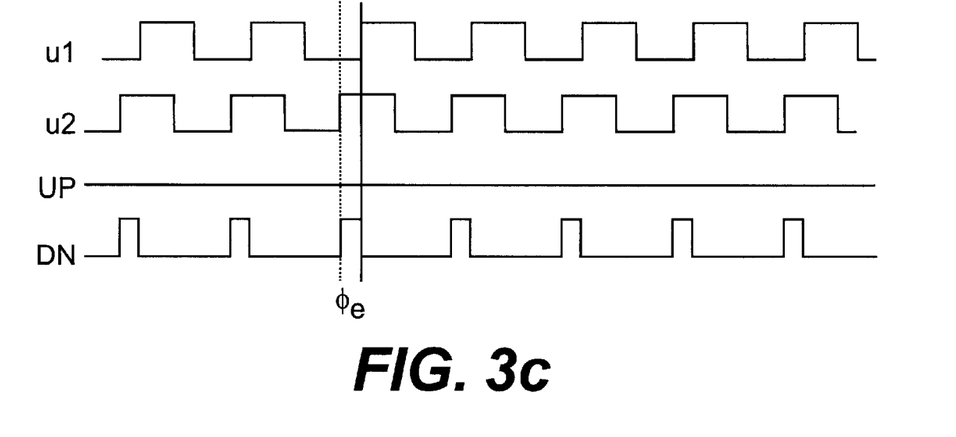
FIG. 3c shows the waveforms associated with the phase-frequency detector (PFD), when there is a negative phase error; the DN portion of the output signal from the PFD is pulsed so as to cause the PFD to be at the −1 state.

FIG. 2 is a schematic diagram of a preferred embodiment of the phase-frequency detector (PFD) described in the all-digital phase-locked loop as shown in FIG. 1. The PFD 30 as shown in FIG. 2 is constructed as consisting of two D-type flip-flops 31 and 32, whose outputs are denoted as "UP" (up) and "DN" (down), respectively. The input signal (designated as u1) and the output signal (designated as u2) are connected to the "CK" input port of the flip-flops 31 and 32, respectively, and their "D" input ports are connected to Vcc. Typically, both outputs of the PFD are initialized at zero states. If the two input signals to be compared by the PED 30 (i.e., $\phi_{in}$ and $\phi_{out}$) are exactly in phase, then the positive edges of these two input signals will occur at the same time. Hence, their effects are canceled against each other, and the output from the PFD 30 will be zero until a difference between the $\phi_{in}$ and $\phi_{out}$ is detected. When the two input signals $\phi_{in}$ and $\phi_{out}$ are out of phase, then the PFD 30 will detect the phase error, which would range from −2π to 2π. FIGS. 3a–3c show three different conditions in which the PFD operates. FIG. 3a shows the waveforms when there is no (i.e., zero) phase error (i.e., u1 and u2 are exactly in phase, or that the positive edges of u1 and u2 occur at the same time and their effects are canceled); the output signals from the PFD are always at the 0 state. FIG. 3b shows the waveforms when there is a positive phase error (i.e., u1 leads u2); the UP portion of the output signal from the PFD is pulsed so as to cause the PFD to be at the +1 state. FIG. 3c shows the waveforms when there is a negative phase error (i.e., u1 lags u2); the DN portion of the output signal from the PFD is pulsed so as to cause the PFD to be at the −1 state. In FIG. 2, Vcc is the voltage level on logic "1". Since PFD can detect phase errors from −2π to 2π, the gain of the PFD, designated as $K_d$ can be calculated as:

$$K_d = Vcc/4\pi$$

The output signals "UP" and "DN" from the PFD 30 are sent to the K-counter 40, which operates in conjunction with the digital control oscillator (DCO) 50 to adjust the frequency of the output of the loop 10. When the total pulse width of the "UP" signals is greater than that of the "DN" signals, the frequency of the loop's output will be reduced (i.e., slowed down). On the other hand, when the total pulse width of the "UP" signals is smaller than that of the "DN" signals, the frequency of the loop's output will be increased (i.e., sped up).

The K-counter 40 works with the DCO 50 to produce a signal which is fed back to the PFD 30 through the divide-by-M counter 60. Included in the K-counter 40 are an up counter 41 and a down counter 42. The K-counter works like a digital loop filter. A carry output (CA) is generated from the up counter 41, and a borrow output (BO) is generated from the down counter 42. The two output signals, CA and BO, are sent as inputs to the DCO 50. If the DN output from the PFD is active, this enables the down section of the K-counter 40 to decrease the count value. When the K-counter 40 is under flow, a "borrow" pulse will be produced. The borrow pulse will force the DCO 50 to select a phase-leading local clock, and the loop's output is "advanced". On the other hand, if the UP output from phase detector PFD 30 is active, then this signal will enable the up counter section of the K-counter 40 to increase the count value. When the K-counter 40 is overflow, a carry pulse will be produced. The carry pulse will cause the DCO 50 to select a phase-lagging local clock, and the loop's output is "delayed".

The value of K in the K-counter 40 is an important parameter. If the value of K is too small, then the K-counter 40 will recycle very often, thus generating a high frequency of carry and/or borrow pulses. This means a high frequency phase hopping of the loop output and a high frequency in the output jitter. On the other hand, if the value of K is too small, the the loop's cut-off frequency will be too low and the lock-in range is too small, thus resulting in a prolonged tracking process.

Figure 4:
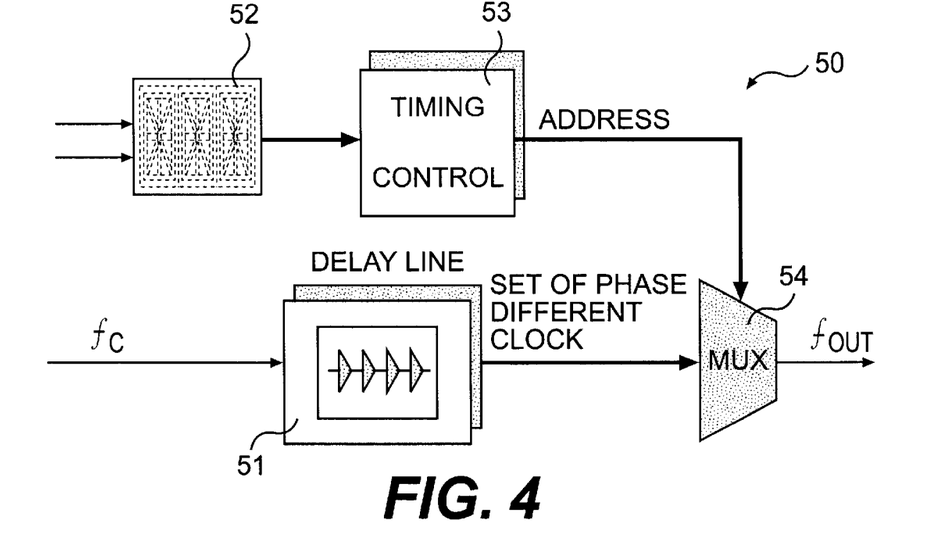
FIG. 4 is a functional block diagram of a preferred embodiment of the digital control oscillator (DCO) for use in the improved all-digital phase-locked loop as shown in FIG. 1.
Figure 5A:
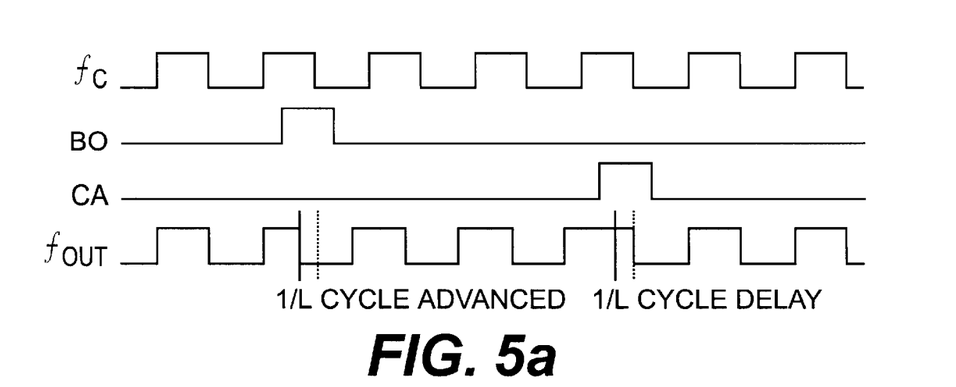
FIG. 5 is a schematic diagram showing the mechanism of the digital control oscillator (DCO) as shown in FIG. 4.
Figure 5B:
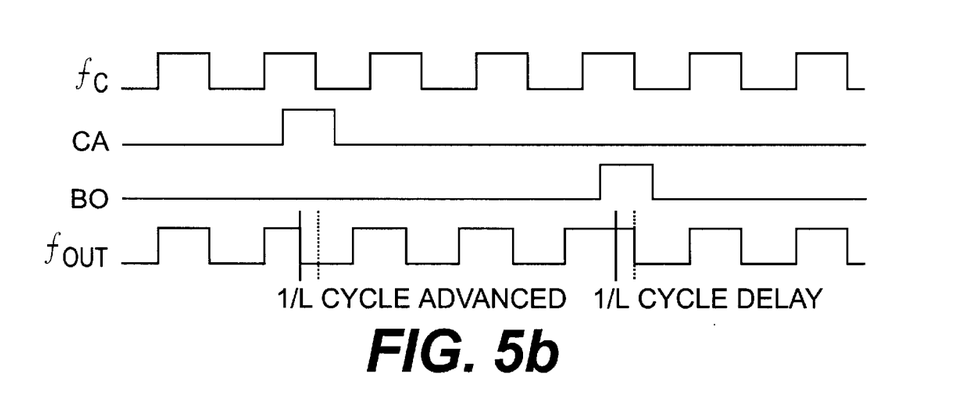

FIG. 4 is a functional block diagram of a preferred embodiment of the digital control oscillator (DCO) 50 for use in the improved all-digital phase-locked loop as shown in FIG. 1. And FIG. 5 is a schematic diagram showing the mechanism of the digital control oscillator (DCO) 50, as shown in FIG. 4. The DCO 50 is a key element of the present invention and one of the key elements of the DCO 50 is the delay line 51 which is divided into L stages (i.e., a L-stage delay line). Other elements of the DCO include an up-down counter 52, a timing control 53, and a multiplexer 54. The delay line 51, which is structurally similar to a pipeline processor, provides a set of phase-different (local) clocks for the DCO 50 to implement the intended phase-hopping action. The up-down counter 52 accepts the carry and borrow signals from the K-counter 40 and outputs an address, via the timing control 53, to the multiplexer 54 to thereby select a corresponding phase-different clock from the set of phase-different clocks, which are provided as outputs from the delay line 51.

Figure 6A:
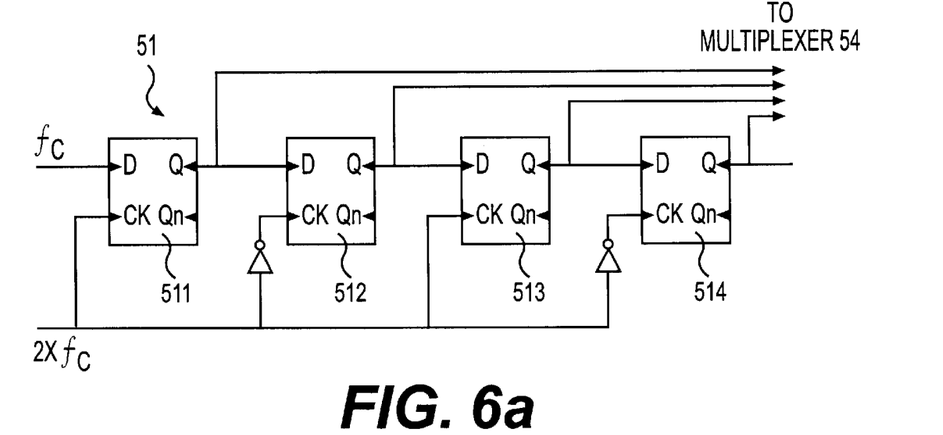
FIG. 6a is a schematic diagram showing the construction of a preferred embodiment of the delay line having 4 stages (i.e., L=4).

FIG. 6a is a schematic diagram showing the construction of a preferred embodiment of the delay line 51 having 4 stages (i.e., L=4). Each phase-different clock is implemented using a flip-flop (FF) 511–514, each flip-flop constitutes a shift register (1-bit). An inverter 517 is provided for every other flip-flop 512, 514 starting from the second flip-flop 512. In the simplest design, the delay line 51 consists of 4 phase-different clocks 511, 512, 513, and 514 and each pair of the neighboring phase-different clocks have a phase difference of $\phi$. Each time the carrier pulse forces the multiplexer to select the phase lagging local clock, the loop's output will be delayed by 1/L cycle. Likewise, each time the borrow signal forces the multiplexer to select a phase leading local clock, the loop's output will be advanced by 1/L cycle. In this construction, the value of $\phi$ must satisfy the following relationship:

$$\pi < \phi L < 2\pi$$

Figure 7:
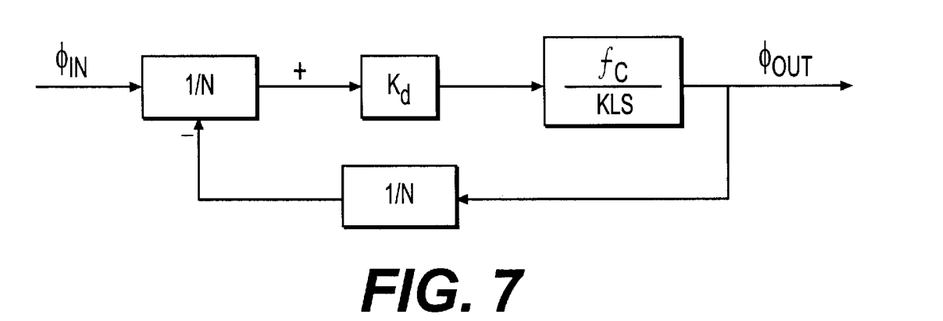
FIG. 7 shows a schematic illustration of the mathematical model representing the operation of the improved all-digital phase-locked loop as shown in FIG. 1.

As described previously, the phase delay caused in each stage (of the L stages) has a very significant influence on the loop's output jitter. In order to reduce the amplitude of the output jitter, the value of $\phi L$ should preferably be as close to $2\pi$ as possible. To achieve this, in a preferred embodiment of the present invention, the delay line is implemented by a series of flip-flops and a trigger clock (i.e., a sample clock) having a frequency that is L/2 times the frequency of the loop's output. Thus, with a 16-stage delay line (i.e., L=16), if the maximum permissible output jitter is 1/16 UI , then a sample clock with a frequency 8 times of UI will satisfy the requirement. Therefore, to implement a locked loop for an E1/T1 rate, the present invention can satisfy the requirement by using a sample clock having a frequency of 32.768 M Hz/24.704 M Hz (i.e., using a 32.768 M Hz/24.704 M Hz oscillator). Because a much slower sample clock is required, the present invention is much economical than the conventional all-digital phase locked loops. Furthermore, because the present invention uses a delay line to provide the phase-different clocks, it exhibits excellent stability and its performance is unaffected by temperature, process, voltage and/or other environmental variations. FIG. 7 shows a schematic illustration of the mathematical model representing the operation of the improved all-digital phase-locked loop as shown in FIG. 1. In FIG. 7, it is assumed that the value of M equals N in typical cases. The mathematical model shown in FIG. 7 indicates that a gain of $f_c/KL$ can be expected from the phase locked loop.

A prototype of the present invention was fabricated in a 0.8 μm standard cell, and the present invention will now be described more specifically with reference to this prototype. It is to be noted that the following descriptions of examples, including the preferred embodiment of this invention, are presented herein for purposes of illustration and description, and are not intended to be exhaustive or to limit the invention to the precise form disclosed.

The output frequency of the all-digital phase-locked loop constructed in the present invention was E1 rate, i.e., 2.048 M Hz. The value of K in the K-counter was 128, and the number of stages L of the delay line was 16. The total gate count was about 750 and the total chip area was about 600 μm×600 μm (not including the dividers). From these parameters, the theoretically maximum amplitude of the output jitter was 0.0625 UI. The maximum permissible frequency offset between the incoming signal and the local clock was 500 ppm. The loop's bandwidth can be calculated using the following formula:

$$F_{3dB} = \frac{K_d f_c}{L \times K \times N} = \frac{5 \times 2.048\,M}{4\pi \times 16 \times 128N \times 2\pi}$$
$$= \frac{63.3}{N}$$
$$\approx 0.03\text{ Hz}$$

wherein N=2048. In the above formula, N is the value of the divisor in the Divide-by-N counter.

Figure 8A:
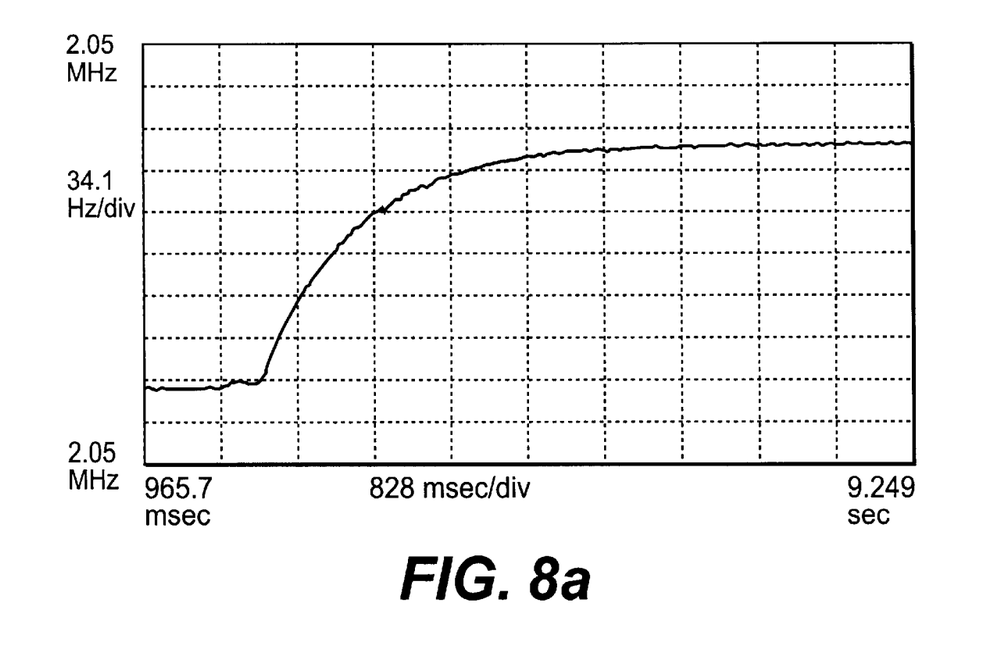
FIG. 8 is a plot showing the tracking process from low frequency to high frequency.
Figure 8B:
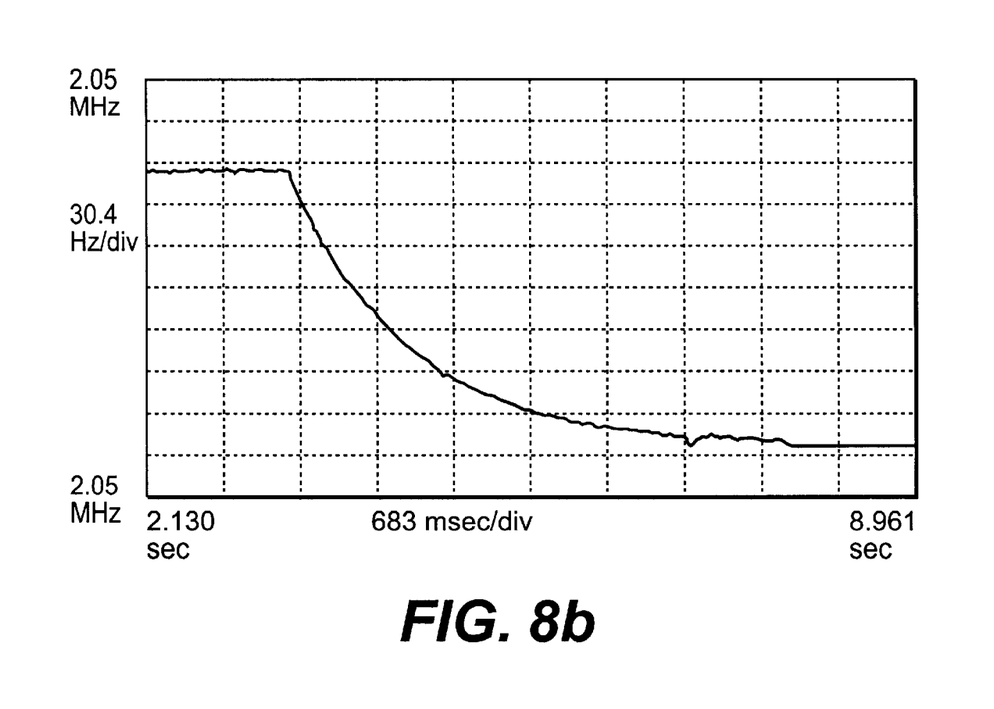
Figure 9:
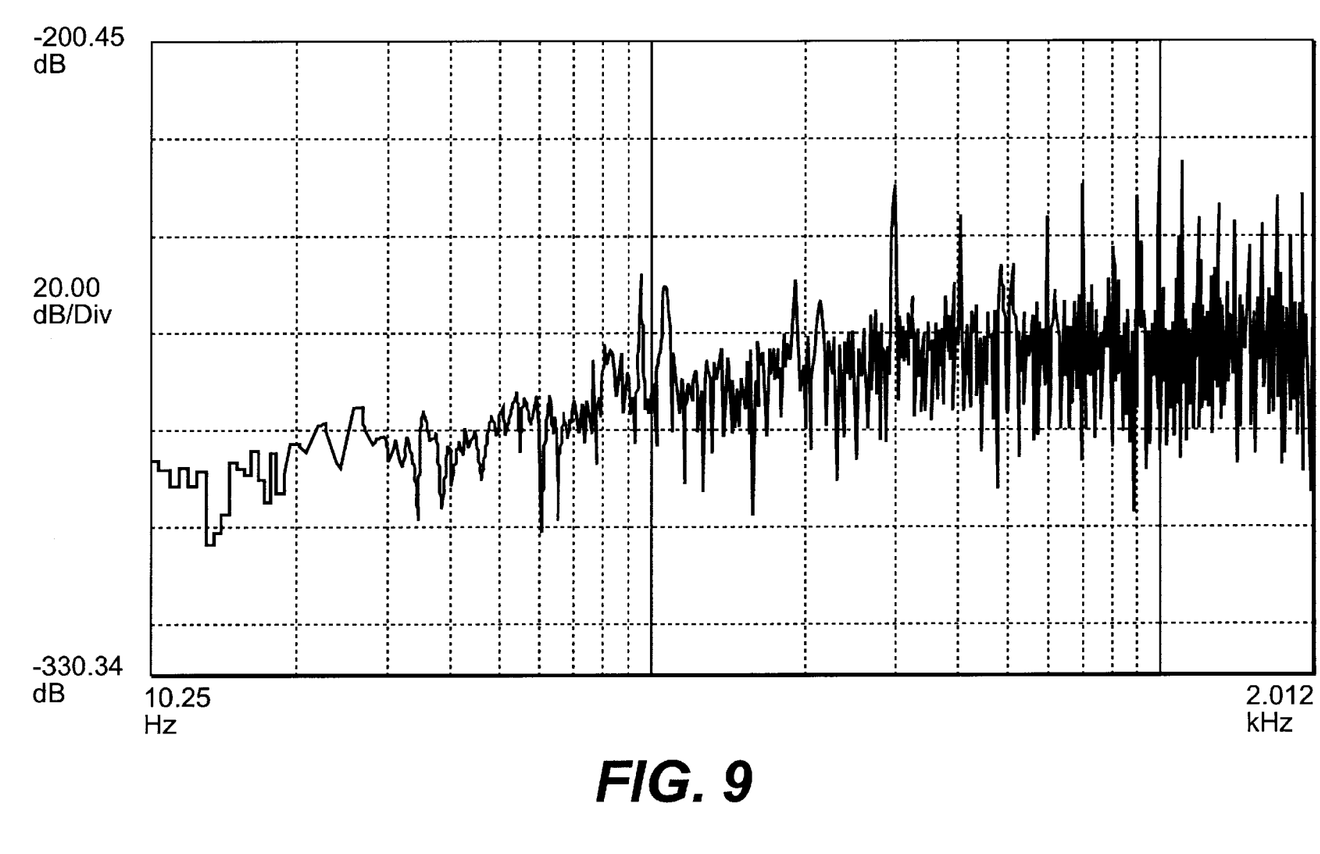
FIG. 9 is a plot of the output jitter spectrum for the case with an input frequency offset of 100 ppm.
Figure 10A:
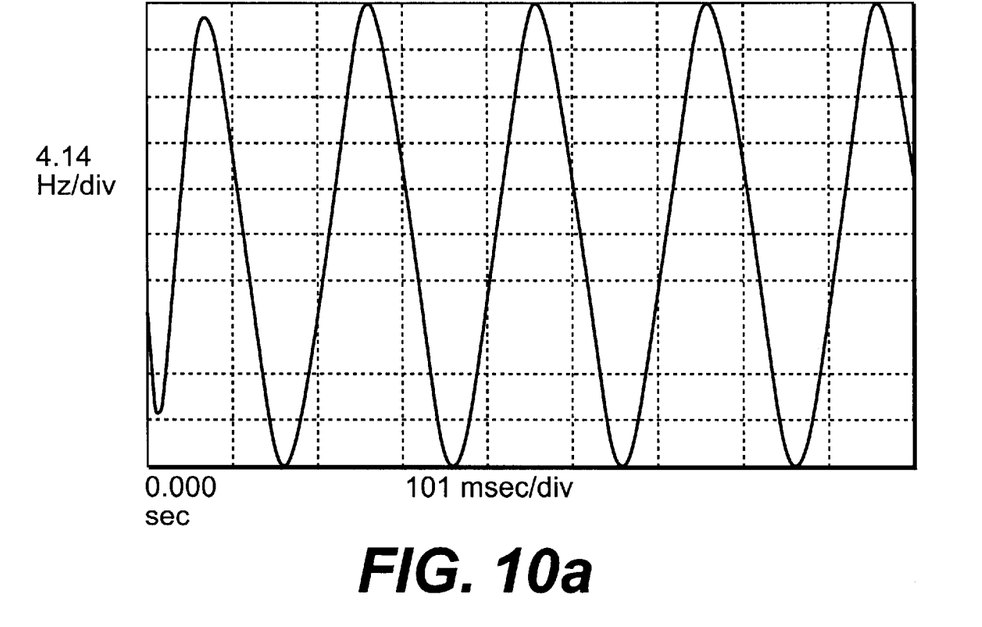
Figure 10B:
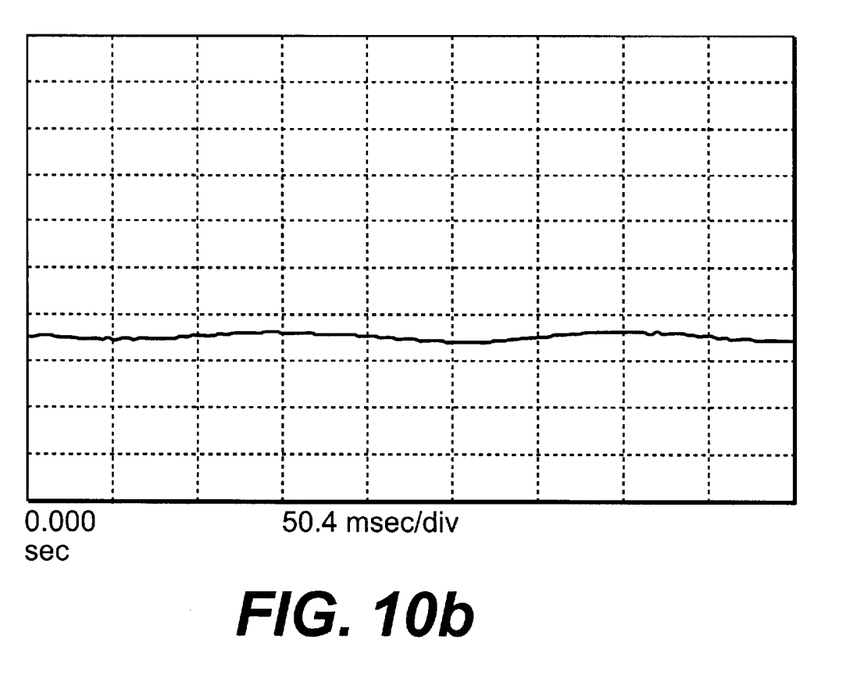
Figure 11A:
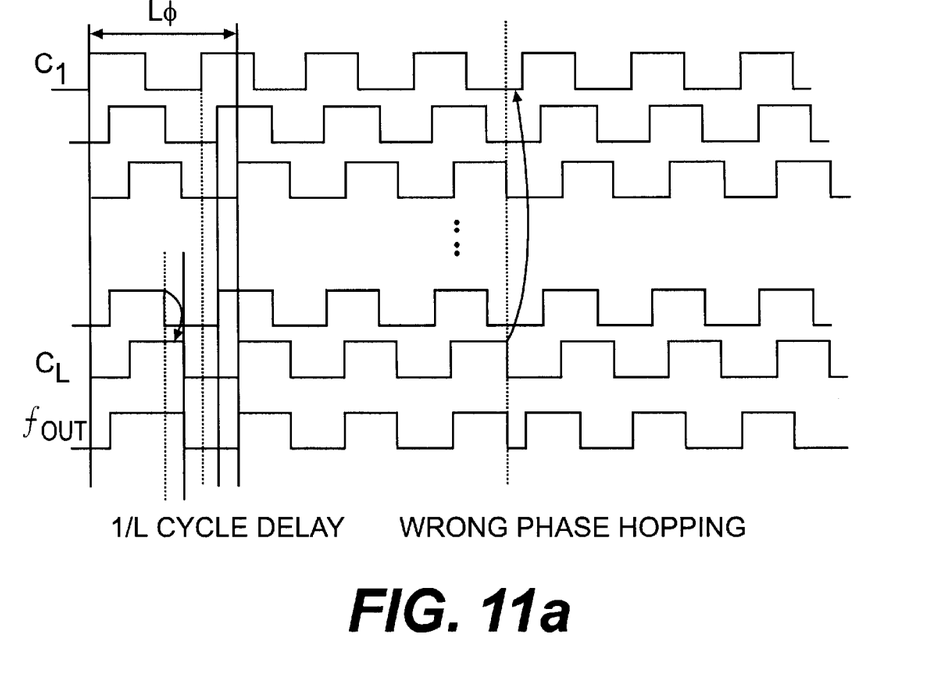
Figure 11B:
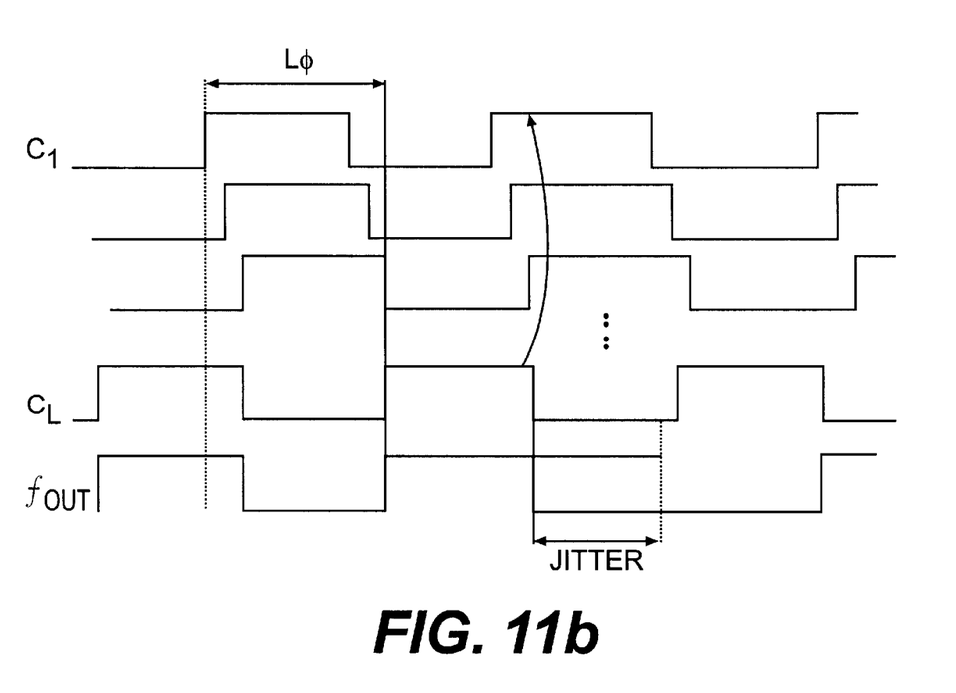

The improved all-digital phase-locked loop constructed above was tested for its lock-in range, tracking time, and output jitter performance. It was also tested for its capability as a low-pass filter. The capability of low-pass filtering is also a very important characteristic in some applications, especially in gapped clock smoothing. FIG. 8 is a plot showing the tracking process from low frequency to high frequency; the lock-in time was measured to be about 3.5 seconds. Since this is a first-order loop, no overshot was observed, i.e., no cycle slip was observed. FIG. 9 is a plot of the output jitter spectrum for the case with an input frequency offset of 100 ppm (FIG. 8a). The maximum peak-to-peak jitter was about 2 KHz, and its amplitude was less than 0.065 UI. The difference between the theoretical value and the measured result was less than 5%. FIGS. 11a and 11b demonstrate the low-pass filtering capability of the improved all-digital phase-locked loop disclosed in the present invention. FIG. 10a shows the input frequency and FIG. 10b shows the output frequency. When the frequency variation in the input clock was 40 Hz, and the frequency modulation frequency was 5 Hz or less, the variation in the filtered output frequency was less than 1 Hz. This demonstrates that the improved all-digital phase-locked loop disclosed in the present invention can provide excellent low-pass filtering capacity.

The improved all-digital phase-locked loop disclosed in the present invention exhibits several advantages over those existing in the prior art. Comparing to the conventional all-digital phase-locked loops such as the SN74297 by Texas Instrument, the present invention requires a much lower sample clock for implementation. To implement a low output jitter and narrow bandwidth all-digital PLL, the main drawback of the conventional systems is the need for a very high frequency sample clock. With an L-staged delay line of the present invention, the required frequency of the sample clock is $f_c L/2$ ($f_c$ is the frequency of the output clock). With an equivalent conventional PLL (also with L stages), the required frequency of the sample clock would be $2f_c L$. Thus the present invention only requires a sample clock operating at ¼ of the frequency as that required by a conventional device. For high speed microprocessors, the present invention represents a significant breakthrough in the digital phase locking technology.

Although the phase-hopping all-digital phase-locked loop described by Chii et al does not require the high-frequency sample clock for implementation, it has not been commercialized due to many implementational difficulties. The main drawback with the phase-hopping PPL is that its design of the delay line consists of gate delays, whose performance is highly dependent on the temperature, process, or voltage variations. In the worst case, the variation in the gate delay can result in delay time that is increased as large as two times that of the designed value, or reduced to as little as one half that of the designed value. Such a large variation can result in a total failure in attempting to acquire a lock-in state or, under a more amicable circumstance, generate a large output jitter. FIGS. 11a and 11b illustrate how the variation in the designed delay time may influence the locking performance. As described above, the value of $\phi$ must satisfy the relationship $\pi<\phi L<2\pi$. In FIG. 11a, the total delay time $\phi L$ is greater than $2\pi$. Under this condition, if the output frequency is faster than the input clock, then the improper phase delay will result in a total failure in the attempted lock-in process. FIG. 11b describes a different situation in which the total delay time satisfies the relationship $\pi<\phi L<2\pi$, but the phase-different clock was caused to fluctuate (i.e., to emulate the influence by the environmental variables). When the selected phase-different clock jumped from $C_L$ to $C_1$, a large output jitter was generated.

In the improved all-digital phase-locked loop disclosed in the present invention, the delay line was implemented using a series of type D flip-flops (FFs) and a sample clock, as shown in FIG. 4. To reduce the required frequency of the sample clock, the present invention utilizes both the positive and negative (implemented via an inverter for every other flip-flop) edges to simultaneously trigger the FFs, to thereby generate a set of phase-different clocks. With this construction, the phase delay is independent of the environment, voltage and/or process variations. Furthermore, the phase difference between each pair of neighboring clocks can be designed to be essentially equal, and the total delay can be designed to be very close to $2\pi$, with the maximum output jitter equaling to $\phi$. These advantageous characteristics of the present invention impart a high controllability of the loop's characteristics to be in close conformity with the designed parameters, thus enabling the performance of the loop to be emulated in advance before implementation. Furthermore, because the performance of the all-digital phase-locked loop of the present invention is independent of the variations in external factors, the circuit can be constructed using a common, off-the-shelf, standard cell, without requiring any extra custom-built cell, thus resulting in significant cost savings and great flexibility in designs.

There are many ways to implement the delay line disclosed in the present invention. FIG. 6a shows a typical embodiment of a 4-stage delay line, in which the sample clock (indicated as $2\times f_c$) was directly input to the first and third FFs, 511 and 513, but was indirectly input to the second and fourth FFs, 512 and 514, respectively, through an intersecting inverter. Signal from the local clock, $f_c$, was directly input to the first FF 511. The output clock from the first FF 511 became the input local clock to the second FF 512, and the output clock from the second FF 512 became the input local clock to the third FF 513, etc. Collectively, the phase-different output clocks C1, C2, C3 and C4, from the four FFs 511, 512, 513, and 514 constituted the delay line and were sent to the multiplexer 54.

Figure 6B:
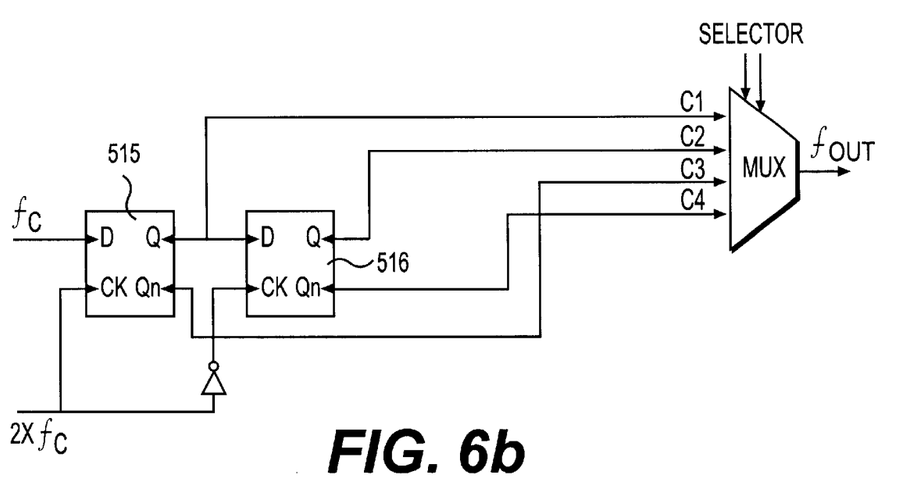
FIG. 6b is a schematic diagram showing the construction of another preferred embodiment of the delay line having 4 stages (i.e., L=4).

FIG. 6b is a schematic diagram of an alternative and simplified embodiment of the delay line as shown in FIG. 6a. The embodiment shown in FIG. 6b provides a similarly 4-staged delay line, but it utilizes only two FFs, 515 and 516. In FIG. 6b, the sample clock (indicated as $2\times f_c$) was directly input to the first FF, 515 but was indirectly input to the second FF, 516 via an intervening invertor. The outputs Q from both FFs became first and second phase-different clocks. However, their negative outputs Qn became the third and fourth phase-different clocks.

Another advantage of the improved all-digital PLL of the present invention is that it does not require the use of an XOR phase detector as used in the prior art loops. With an XOR, if the K value is small than N/4, a duty-cycle error in the loop's output will result. In addition, the XOR phase detector is very sensitive to the initial state of the input signals. An improper initial state can result in a never-ending tracking process or at least a very long lock-in time. In the present invention, the PFD is used in the place of the XOR of prior art. With this modification, unexpected advantageous results were observed. First, the loop's characteristic is independent of the value of K. This allows a great flexibility in choosing the optimum K value so as to accelerate the lock-in process under the constraint of a maximum permissible amplitude of the output jitter. Secondly, the present invention is initialization insensitive. This advantageous characteristic allows the present invention to be more stable in performance and easier to implement.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An all-digital phase-locked loop for locking a local signal in phase with an input signal comprising:

(a) a digital control oscillator for receiving said local signal and generating said output signal;

(b) a K-counter for providing first control signals to said digital control oscillator;

(c) a phase frequency detector for receiving and comparing said output signal and said input signal for providing second control signals to said K-counter according to a detected difference between said input and output signals;

(d) wherein said digital control oscillator comprising a delay line means, an address generator and a multiplexer, said delay line means comprising a shift register and a trigger clock connected to said shift register so as to generate a plurality of phase-different clocks for implementing phase hopping action to said multiplexer responsive to a frequency control signal, said address generator comprising input means for receiving said first control signals from said K-counter and output means for sending an address to said multiplexer according to said first control signals so as to select a clock from said plurality of phase-different clocks, and said selected clock becoming said input signal.

2. An all-digital phase-locked loop according to claim 1 which further comprises:

(a) a divide-by-M counter disposed between said digital control oscillator and said frequency detector and;

(b) a divide-by-N counter disposed before said phase frequency detector and an incoming line of said input signal; wherein M and N are positive integers.

3. An all-digital phase-locked loop according to claim 1 wherein said phase frequency detector comprises a pair of D-type flip-flops, said pair of flip-flops having their first input ports connected to said input signal and said output signal, respectively, and their second input ports connected to Vcc.

4. An all-digital phase-locked loop according to claim 1 wherein said K-counter comprises an up counter and a down counter.

5. An all-digital phase-locked loop according to claim 1 wherein said address generator further comprises an up-and-down counter, which is connected to said input means of said address generator for receiving said first control signals from said K-counter and said output means of said address generator for sending said address to said multiplexer.

6. An all-digital phase-locked loop according to claim 1 wherein said address generator is programmed such that it will cause said multiplexer to select a phase lagging local clock or a phase leading local clock according to said address signal received from said address generator.

7. An all-digital phase-locked loop according to claim 1 wherein said shift register means comprises L flip-flops, L being an integer, for generating L phase-different clocks.

8. An all-digital phase-locked loop according to claim 7 wherein said shift register means is constructed in the following manner:
   (a) said shift register means comprise a plurality of first and second flip-flops which are connected alternately and in series;
   (b) each of said first and second flip-flops comprises a first and second inputs and an output;
   (c) said second inputs of said first flip-flops are connected to said trigger clock;
   (d) said second inputs of said second flip-flops are connected to said trigger clock via an inverter;
   (e) said first input of said first flip-flop is connected to said local signal, and said output of said first flip-flop is connected to both said multiplexer and said first input of a next flip-flop; and
   (f) each of said next flip-flops is wired in such a manner that its first input is connected to said output of a previous flip-flop and its own output is connected to both said multiplexer and said first input of a further next flip-flop, if such further next flip-flop exists.

9. An all-digital phase-locked loop according to claim 7 wherein each said flip-flops has a phase delay $\phi$, which is calculated according to the following formula:

$$\Phi \cong \frac{2 \times \pi}{L}.$$

10. An all-digital phase-locked loop according to claim 1 wherein said shift register means comprises L/2 flip-flops, L being an integer, for generating L phase-different clocks.

11. An all-digital phase-locked loop according to claim 10 wherein said shift register means is constructed in the following manner:
   (a) said shift register means comprises a plurality of first and second flip-flops that are connected alternately and in series;
   (b) each of said first and second flio-flops comprises first and second inputs and first and second outputs, said second output being an inverse of said first output;
   (c) said second inputs of said first flip-flops are connected to said trigger clock;
   (d) said second inputs of said second flip-flops are connected to said trigger clock via an inverter;
   (e) said first flip-flop is wired in such a manner that its first input is connected to said local signal, its first output is connected to both said multiplexer and said first input of a next flip-flop. and its second output is connected to said multiplexer; and
   (f) each of said next flip-flop is wired in such a manner that its first input is connected to said first output of a previous flip-flop, its own first output is connected to both said multiplexer and said first input of a further next flip-flop, if such further next flip-flop exists, and its own second output is connected to said multiplexer.

12. An all-digital phase-locked loop according to claim 10, wherein each said flip-flop has a phase delay $\phi$, which is calculated according to the following formula:

$$\Phi = \frac{2 \times \pi}{L}$$

* * * * *